United States Patent [19]

Kogan

[11] Patent Number: 5,200,983
[45] Date of Patent: Apr. 6, 1993

[54] FISO ANALOG SIGNAL ACQUISITION SYSTEM EMPLOYING CCD ARRAY STORAGE

[75] Inventor: Grigory Kogan, Portland, Oreg.

[73] Assignee: Tektronix, Inc., Wilsonville, Oreg.

[21] Appl. No.: 836,436

[22] Filed: Apr. 17, 1992

[51] Int. Cl.[5] .............................................. G11C 27/04
[52] U.S. Cl. ........................................ 377/57; 377/60; 377/63
[58] Field of Search ................ 377/57, 60, 63; 357/24

[56] References Cited

U.S. PATENT DOCUMENTS

| | | | |
|---|---|---|---|
| 4,223,233 | 9/1980 | Cappon et al. | 377/57 |
| 4,612,522 | 9/1986 | Dyck | 377/60 |
| 4,803,710 | 2/1989 | Elabd | 377/60 |
| 4,951,302 | 8/1990 | Peter et al. | 377/57 |
| 5,144,525 | 9/1992 | Saxe et al. | 365/45 |

*Primary Examiner*—John S. Heyman
*Assistant Examiner*—Scott A. Ouellette
*Attorney, Agent, or Firm*—Boulden G. Griffith

[57] ABSTRACT

A FISO analog signal acquisition system includes a plurality of CCD arrays (20a-20d), with each array containing a plurality of CCD serial registers (22). Each serial register (22) has a first cell (23) and a large number of additional cells (24) coupled in series with the first cell (24), with acquired samples being transferred along the string of additional cells (24) according to a clock signal having two or more phases, with each CCD array (20a-20d) operating in response to a set of clock signals having a different phase (P1,P2,/P1,/P2). A tapped delay line (10), or other similar hold signal generating means, produces a plurality of closely spaced-in-time sequential hold signals in response to a master hold signal. In response to each one of the hold signals, a CMOS transistor ($Q_x$) briefly connects an associated first cell (23) to the signal to be sampled so that a series of closely spaced-in-time samples of the signal are acquired. When all of the first cells (23) in one array (20x) are full, the first cells (23) of the next array (20x+1) begin to fill. While each array (20x+1) is filling, clocks to the preceding array (20x) shift the acquired data one location along the CCD serial shift registers (22). The process of acquiring and shifting data is repeated rapidly across the plurality of arrays (20a-20d) until they are filled. The data is then readout slowly through a parallel-in, serial-out CCD shift register (25) connected across the ends of all of the registers (22) of all of the CCD arrays (20a-20d).

6 Claims, 3 Drawing Sheets

# FISO ANALOG SIGNAL ACQUISITION SYSTEM EMPLOYING CCD ARRAY STORAGE

FIELD OF THE INVENTION

This invention relates to high speed fast-in, slow-out analog data acquisition systems, and more particularly to such an data acquisition system that employs CMOS transistor controlled capture cells, a tapped delay line hold signal generator, and arrays of charge coupled devices (CCDs) as data storage.

BACKGROUND OF THE INVENTION

Co-pending patent application Ser. No. 07/589,222 by Saxe et al. for an "Analog Acquisition System Including a High Speed Timing Generator", hereby incorporated by reference, describes a fast-in, slow-out (FISO) analog data acquisition system in which a tapped delay line, or some other source of closely spaced-in-time sequential timing signals, clocks high speed analog data into analog capture cells, which then transfer that data to a more extensive analog memory array. When data acquisition is complete, the voltage levels stored in the analog memory array are transferred out and quantified.

A variety of tapped delay lines and other sources of closely spaced-in-time sequential timing signals are described in the U.S. patent Ser. No. 07/589,222 application. Another co-pending patent application, Ser. No. 07/824,434 by the present inventor for a "High Speed Sample and Hold Signal Generator", hereby incorporated by reference, describes several other ways to generate closely spaced-in-time sequential timing signals.

The analog capture cells and the analog memory array described in the U.S. patent Ser. No. 07/589,222 application are both based on capacitors and CMOS (Complementary Metal Oxide Semiconductor) transistors. As the size of such an analog memory array is increased, it presents increasing input capacitance to the analog capture cells that must transfer voltage levels to it. This increasing capacitance degrades the quality of the data acquired and ultimately limits the acquisition speed of the system.

Charge coupled devices present a very low input capacitance and have previously been used as sampling devices and storage units for analog acquisition systems. U.S. Pat. No. 4,648,072 to Hayes et al. for "High Speed Data Acquisition Utilizing Multiplex Charge Transfer Devices", hereby incorporated by reference, discloses a data acquisition system that utilizes CCDs. Referring to FIG. 2 of the '072 patent, in this system the signal to be sampled is applied to two diodes (68,70) which are each input to a data channel. Each data channel contains a serial input register (62,62') of CCDs. The serial input registers of CCDs are 16 stages long and each provide input to a 16×33 stage storage array of CCDs, which in turn provide input to 16-stage CCD output registers. This serial-parallel-serial (SPS) organization provides for fast-in, slow-out (FISO) operation.

In the system described in the '072 patent, samples are moved along each part of the SPS structures of both channels by a 4-phase clock signal. The data acquisition rate is determined by the frequency of a two phase sampling clock (S1/S3) that clocks the signals in each channel from the input diodes to the input of the serial CCD input registers. Two samples of the signal being acquired are clocked into the first serial CCD input register by each cycle of the sampling clock, so that two consecutive samples of the input signal are acquired during each transfer clock cycle, one by each channel. To keep up with the incoming data, the clocks ($\phi 1A$–$\phi 4A$) that move the data through the first, serial portion of the SPS structure must operate at the same speed as the sampling clocks (S1/S3). Since clocks for moving data through CCDs must have a large voltage swing and producing that large voltage swing at high frequencies requires very high amplifier slew rates, the overall acquisition speed of this system is limited by the CCD clock rate.

U.S. Pat. No. 4,951,302 to Peter et al. for "Charge-Coupled Device Shift Register", hereby incorporated by reference, discloses a two-phase CCD shift register having a four-phase input section to boost data acquisition speeds. It also employs the SPS-type architecture described in connection with the '072 patent.

SUMMARY OF THE INVENTION

In accordance with the present invention, an analog signal acquisition system includes a plurality of CCD arrays, with each array containing a plurality of serial registers of charge coupled devices. Each serial register has a first cell and a large number of additional cells coupled in series with the first cell, with acquired samples being transferred along the string of additional cells according to a clock signal having two or more phases, with each array operating in response to a set of clock signals having a different phase. A tapped delay line, or other similar hold signal generating means, produces a plurality of closely spaced-in-time sequential hold signals in response to a master hold signal. In response to each one of the hold signals, a CMOS transistor briefly connects an associated first cell to the signal to be sampled so that a series of closely spaced-in-time samples of the signal are acquired. When all of the first cells in one array are full, the first cells of the next array begin to fill. While the each array is filling, clocks to the preceding array shift the acquired data one location along the serial shift registers associated with each capture cell. The process acquiring and shifting data is repeated rapidly across the plurality of arrays until they are all full. The data is then readout slowly through a parallel-in, serial-out CCD shift register connected across the ends of all of the registers of all of the CCD arrays.

DETAILED DESCRIPTION

Figure 1:
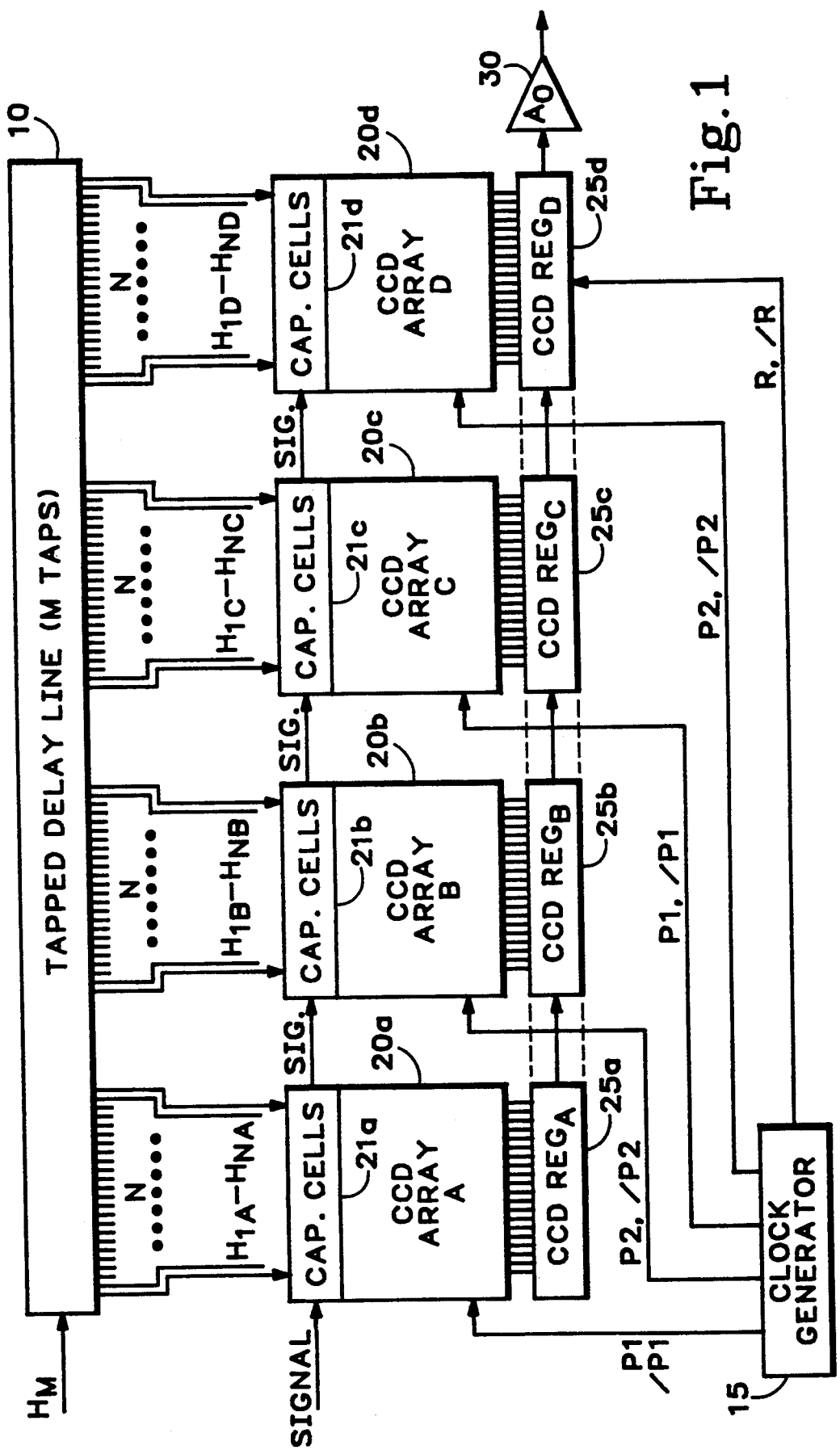
FIG. 1 is a block diagram of a data acquisition system according to the present invention.

Referring to FIG. 1, an analog SIGNAL to be acquired is applied to each of individual capture cells within sets of capture cells 21a–21d of four CCD arrays 20a–20d. A master hold signal $H_M$ goes active at the input of a tapped delay line 10 at a relatively low frequency. In response to the master hold signal $H_M$, the tapped delay line 10 produces a long sequence of closely and evenly spaced-in-time hold signals $H_{1A}$–$H_{ND}$. The hold signals are divided into four equal groups, $H_{1A}$–$H_{NA}$, $H_{1B}$–$H_{Nb}$, $H_{1C}$–$H_{NC}$, and $H_{1D}$–$H_{Nd}$, and these groups of hold signals are applied to the sets of capture cells 21a-21d, with one hold signal going to each individual capture cell.

Figure 2:
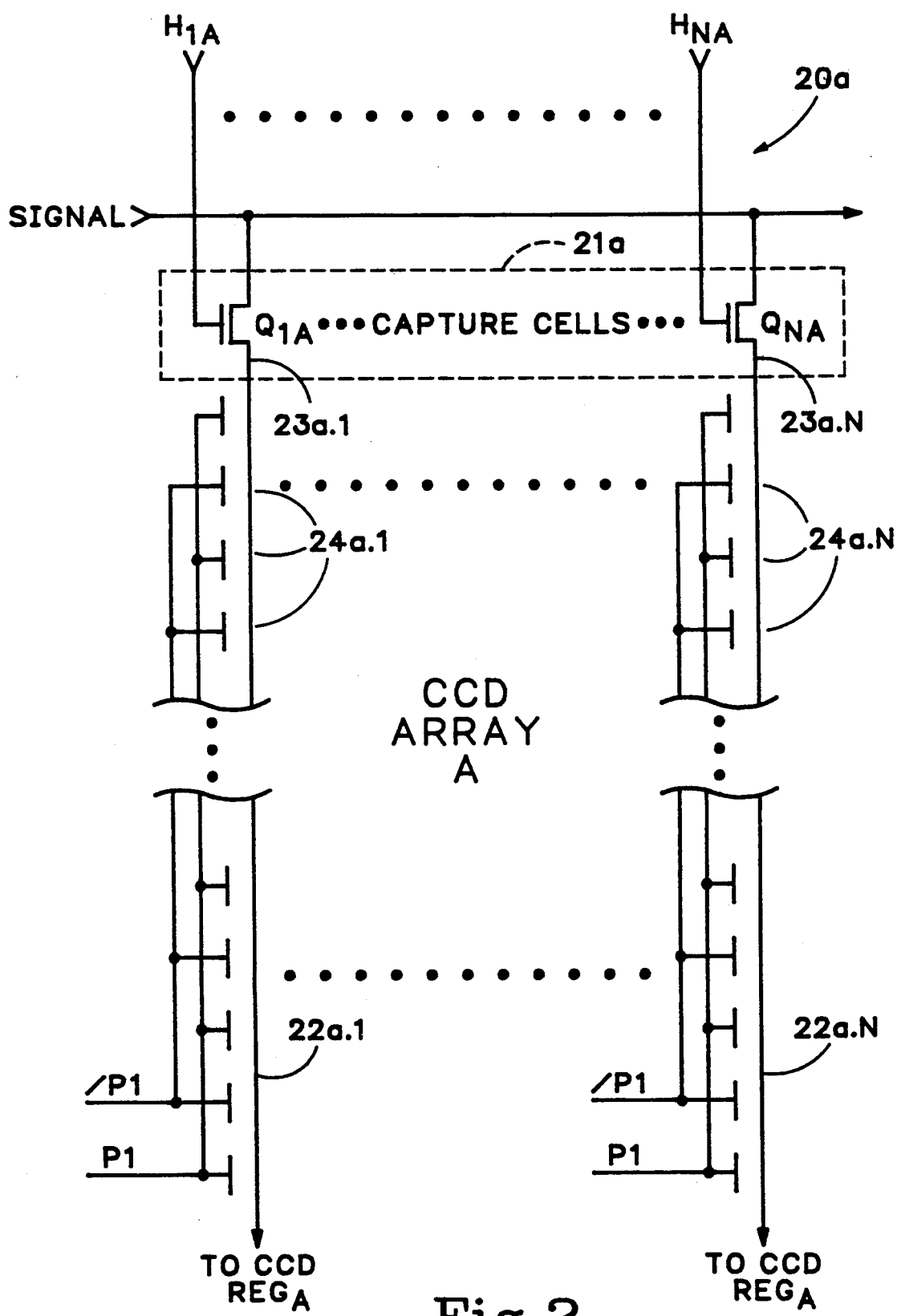
FIG. 2 is a simplified schematic diagram of one of the CCD arrays shown in FIG. 1.

Referring now to FIG. 2 as well as FIG. 1, each set of capture cells 21a-21d and the CCD arrays 20a-20d to which they are input are the same internally, so only CCD array A 20a will be described in detail. The only difference between the CCD arrays 20a-20d is the clock signals that are used to move data through them. Clock generator 15 produces four phases of clock, P1, P2, /P1, and /P2, each separated by 90°. Alternate cells of CCD array A 20a are clocked by P1 and /P1. Alternate cells of CCD array B 20b are clocked by P2 and /P2. Alternate cells of CCD array C 20c are clocked by /P1 and P1. And, alternate cells of CCD array D 20d are clocked by /P2 and P2.

Referring now to FIG. 2, each CCD array 20a-20d contains a plurality N of 2-phase CCD shift registers $22a.1-22a.N$. The first cell $23a.1-23a.N$ of each register $22a.1-22a.N$ is connected to the source of an NMOS transistor $Q_{1A}-Q_{NA}$. The sources of transistors $Q_{1A}-Q_{NA}$ can either be conventional diffusion or CCD channel type. The drains of all of the NMOS transistors $Q_{1A}-Q_{NA}$ are connected to the SIGNAL to be acquired. The gates of NMOS transistors $Q_{1A}$ to $Q_{NA}$ are controlled by hold signals $H_{1A}$ through $H_{NA}$, respectively.

Figure 3:
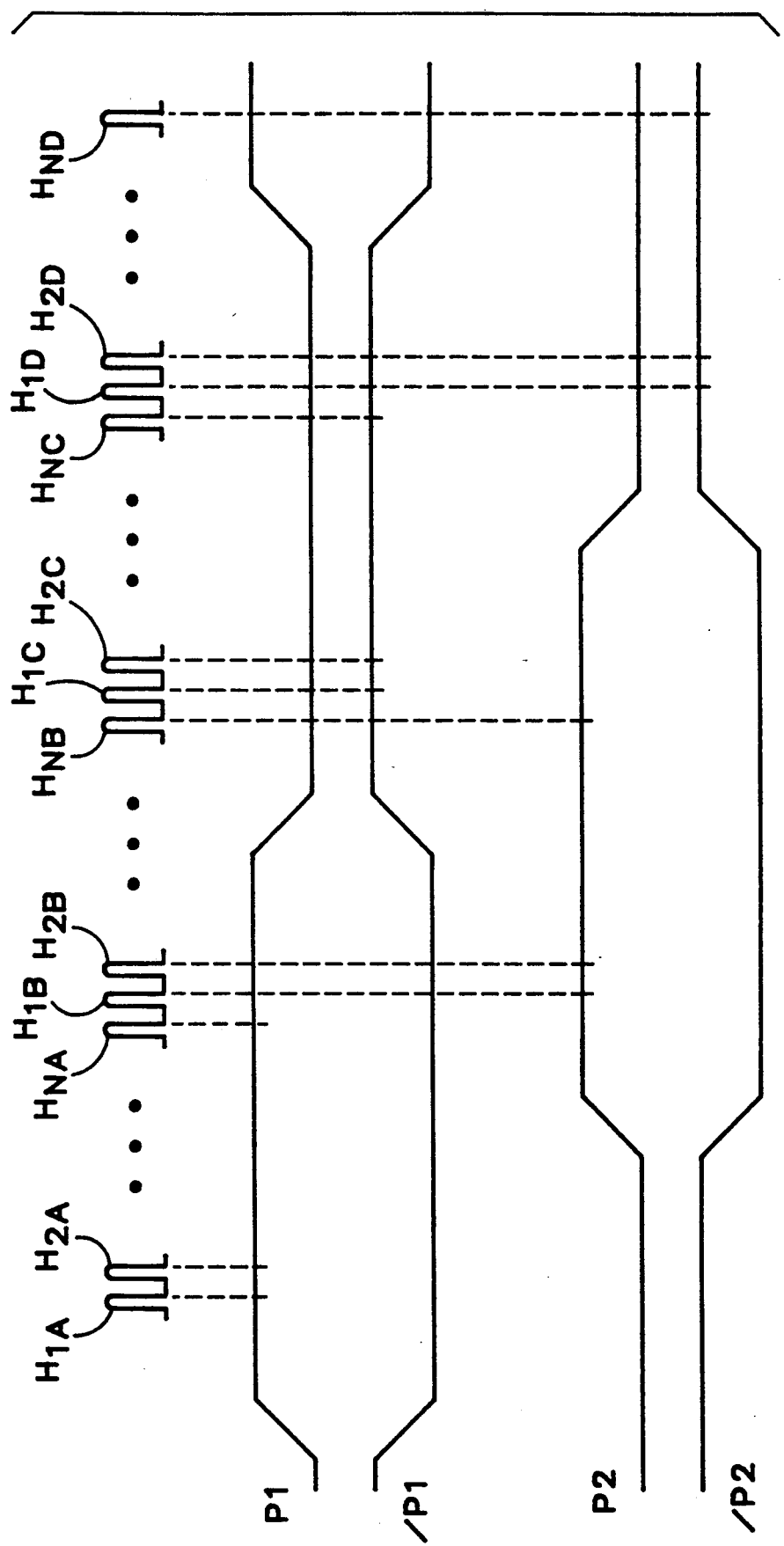
FIG. 3 is a timing diagram illustrating the operation of the circuitry shown in FIGS. 1 and 2.

Referring now to FIG. 3, $H_{1A}$ through $H_{NA}$ go active-high during a time interval in which the first phase clock P1 is high and the first cell $23a.1-23a.N$ in each CCD shift register $22a.1-22a.N$ of CCD array A 20a is active. Similarly, $H_{1B}$ through $H_{NB}$ go active-high during a time interval in which the second phase clock P2 is high and the first cell $23b.1-23b.N$ in each CCD shift register $22b.1-22b.N$ of CCD array B 20b is active; $H_{1C}$ through $H_{NC}$ go active-high during a time interval in which the third phase clock /P1 is high and the first cell $23c.1-23c.N$ in each CCD shift register $22c.1-22c.N$ of CCD array C 20c is active; and, $H_{1D}$ through $H_{ND}$ go active-high during a time interval in which the fourth phase clock /P2 is high and the first cell $23d.1-23d.N$ in each CCD shift register $22d.1-22d.N$ of CCD array D 20d is active.

Referring again to FIG. 2, when $H_{1A}$ goes high, transistor $Q_{1A}$ conducts fully and the potential well of the first cell $23a.1$ of CCD shift register $22a.1$ charges in accordance with the voltage present on the SIGNAL line. When $H_{1A}$ goes back to its low level, transistor $Q_{1A}$ is shut off and the charge on the first cell $23a.1$ of CCD shift register $22a.1$ is isolated. As hold signals $H_{2A}$ through $H_{NA}$ occur, charges are also stored on the first cells $23b.2-23b.N$ of each of the shift registers $22a.2$ through $22a.N$, with these charges representing the states of the SIGNAL at a series of evenly and closely spaced times.

Referring again to FIGS. 1 and 3, when each capture cell in CCD array A has stored a sample, the next hold signal after $H_{NA}$ is $H_{1B}$. The delay between $H_{NA}$ and $H_{1B}$ is the same length as the delay between each of the $H_{XA}$ hold signals, so that evenly spaced samples are obtained even across CCD array boundaries. The hold signals $H_{1B}$ through $H_{NB}$ cause data to be captured by each of the capture cells 20b of CCD array B 20b. The progression continues in like manner until the $H_{1C}$ through $H_{NC}$ and $H_{1D}$ through $H_{ND}$ hold signals have caused data to be captured by the capture cells 21c and 21d of CCD arrays C and D 20c and 20d.

During the time that the second phase clock P2 is active and hold signals $H_{1B}-H_{NB}$ are causing data to be captured by the capture cells 21b of CCD array B 20b, the first phase clock P1 goes inactive-low and the third phase clock /P1 goes active-high. This causes the charges in the first cells $23a.1-23a.N$ of CCD array A 20a to advance one cell along the CCD shift registers $22a.1$ through $22a.N$. Similarly, during the time that the third phase clock /P1 is active and hold signals $H_{1C}-H_{NC}$ are causing data to be captured by the capture cells 21c of CCD array C 20c, the second phase clock P2 goes low and the fourth phase clock /P2 goes active. This causes the charges in the first cells $23b.1-23b.N$ of CCD array B 20b to advance one cell along the CCD shift registers $22b.1$ through $22b.N$. And, during the time that the fourth phase clock /P2 is active and hold signals $H_{1D}-H_{ND}$ are causing data to be captured by the capture cells 21d of CCD array D 20d, the third phase clock /P1 goes low and the first phase clock P1 goes active. This causes the charges in the first cells $23c.1-23c.N$ of CCD array C 20c to advance one cell along the CCD shift registers $22c.1$ through $22c.N$. And finally, during the time that the first phase clock P1 is active and hold capture cells 21a of CCD array A 20a, the fourth phase clock /P2 goes low and the second phase clock P2 goes active. This causes the charges in the first cells $23d.1-23c.N$ of CCD array D 20d to advance one cell along the CCD shift registers $22d.1$ through $22d.N$.

Slower data acquisition can be accomplished using this same array by only enabling a subset of the individual capture cells on each pass through the array. The discussion associated with FIGS. 17 and 18 of the 07/589,222 application, previously incorporated by reference, describes one method for accomplishing this result.

The process described above eventually produces four CCD arrays 20a-20d that are full of data. This data has been acquired at a speed that is $M \times f_{clk}$ or $4 \times N \times f_{clk}$, where $f_{clk}$ is the frequency of the four clock phases P1-/P2, M is the number of taps on the tapped delay line 10, N is the number of individual capture cells within the sets of capture cells 21a-21d, and M=4N. This represents a vast improvement over the approaches shown in the CCD prior art, in which the maximum data rate was two or four times the acquisition clock frequency. The maximum acquisition rate of the present invention is now determined by how small the intervals between successive taps on the tapped delay line 10 can be made. The problems and limitations involved in hold signal generation are discussed in the 07/589,222 application discussed above and previously incorporated by reference.

The filling of the CCD arrays A-D 20a-20d just described is the "fast-in" part of the FISO (fast-in, slow-out) operation. Once the arrays are full, the slow-out process can occur. Referring again to FIG. 1, each of the four CCD arrays 20a-20d applies its output to the inputs of a parallel-in, serial-out CCD output shift register CCD $REG_{A-D}$ 25a-25d, which is actually one continuous register, as indicated by the dashed lines connecting its four parts, $REG_A$ to $REG_D$. During readout, all of the CCD arrays 20a-20d are clocked once to load the combined output shift register CCD $REG_{A-D}$. The output shift register CCD $REG_{A-D}$ is then clocked M times by the 2-phase clocks R and /R, sending the acquired data in serial form through output buffer amplifier $A_O$. Then the CCD arrays 20a-20d are clocked once again, and the serial readout of CCD $REG_{A-D}$ is repeated. This parallel and serial clocking out process continues until all of the stored data has been read out.

While the CCD shift registers described above operate according to a 2-phase clock, the principles of the invention could be applied using CCD shift registers of types that employ clocks having a greater number of phases.

While a preferred embodiment of the present invention has been shown and descried, it will be apparent to those skilled in the art that many changes and modifications may be made without departing from the invention in its broader aspects. The claims that follow are therefore intended to cover all such changes and modifications as fall within the true scope of the invention.

I claim:

1. An analog signal acquisition system comprising:

a plurality of CCD arrays (20a-20d), each array containing a plurality of serial registers (22) of charge coupled devices, each serial register (22) having a first cell (23) and a plurality of additional cells (24) coupled in series with the first cell (23), with acquired samples being transferred along the plurality of additional cells (24) according to a clock signal having a plurality of phases, each array (20a-20d) operating in response to a clock signal of a different phase (P1,P2,/P1,/P2);

means (10) for producing a plurality of sequential hold signals in response to a master hold signal; and a plurality of sampling means ($Q_X$), each responsive to one of the plurality of sequential hold signals, for temporarily connecting an associated first cell (23) to a signal to be sampled so that the associated first cell acquires a sample at a time determined by a respective one of the sequential hold signals.

2. A system according to claim 1 wherein the means for producing comprises a tapped delay line (10).

3. A system according to claim 1 wherein the sampling means are CMOS transistors ($Q_X$) that turn on in response to active hold signals.

4. A method for high speed analog signal acquisition, comprising the steps of:

generating (10) a plurality of sequential hold signals closely spaced-in-time in response to a master hold signal;

sequentially providing groups of the sequential hold signals to each of a plurality of CCD arrays (20a-20d);

receiving (21) samples of a signal being acquired into input cells (23) of each CCD array (20a-20d) at times determined by the sequentially provided hold signals; and transferring samples from input cells (23) to next cells (24) within one CCD array (20x) while another CCD array (20x+1) is receiving samples.

5. A method according to claim 4 wherein the generating step comprises the step of utilizing a tapped delay line (10).

6. A method according to claim 4 wherein the receiving step comprises the steps of:

turning on a CMOS transistor ($Q_X$) when the hold signal goes to a first state to connect the input cell (23) to the signal being acquired; and turning off the CMOS transistor ($Q_X$) when the hold signal goes to a second state to disconnect the input cell (23) from the signal being acquired to leave a charge trapped on the input cell (23), the charge being indicative of a level of the signal being acquired at the time of a first-to-second state transition of the hold signal.

* * * * *